United States Patent
Pepper et al.

(10) Patent No.: US 6,818,880 B2
(45) Date of Patent: Nov. 16, 2004

(54) ENHANCED PHOTO-EMF SENSOR WITH HIGH BANDWIDTH AND LARGE FIELD OF VIEW

(75) Inventors: David M. Pepper, Malibu, CA (US); Marvin B. Klein, Pacific Palisades, CA (US); David Nolte, Lafayette, IN (US); Gilmore J. Dunning, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/259,259

(22) Filed: Sep. 26, 2002

(65) Prior Publication Data

US 2003/0151102 A1 Aug. 14, 2003

Related U.S. Application Data

(60) Provisional application No. 60/325,278, filed on Sep. 26, 2001.

(51) Int. Cl.$^7$ .............................................. H01L 31/00
(52) U.S. Cl. ............................... 250/214.1; 250/214 R; 257/21
(58) Field of Search .......................... 250/214.1, 214 R; 257/21, 53, 448, 458, E31.066

(56) References Cited

U.S. PATENT DOCUMENTS

| | | | |
|---|---|---|---|
| 4,281,208 A | 7/1981 | Kuwano et al. | 136/249 |
| 4,924,285 A | 5/1990 | Anderson et al. | 357/30 |
| 5,512,763 A | * 4/1996 | Allam | 257/21 |
| 6,342,721 B1 | 1/2002 | Nolte et al. | 257/448 |

OTHER PUBLICATIONS

Coy, J.A., et al., "Asymmetric Interdigitated Metal–Semiconductor–Metal Contacts for Improved Adaptive Photoinduced–Electromotive–Force detectors," *J. Opt. Soc. Am. B*, vol. 17, No. 5, pp 697–704 (May 2000).

Pepper, D.M., et al., "Enhanced Responsivity of Photo–Induced–emf Adaptive Photodetectors Using Asymmetric Interdigitated Contacts: Scaling Limits and Application to Laser Ultrasound Sensing," *Nonlinear Optics: Materials, Fundamentals, and Applications. Technical Digest, Tops* vol. 46, pp 65–67 (2000).

Nolte, D.D., "Optical Scattering and Absorption by Metal Nanoclusters in GaAs," *J. Appl. Phys.*, vol. 76, No. 6, pp 3740–3745 (Sep. 15, 1994).

* cited by examiner

*Primary Examiner*—Thanh X. Luu
*Assistant Examiner*—Seung C. Sohn
(74) *Attorney, Agent, or Firm*—Ladas & Parry LLP (57) ABSTRACT

A photo-EMF sensor and a method of making same has a substrate with a semiconducting layer; a plurality of sensing regions in the layer, each sensing region including (i) a pair of electrodes disposed in, on or above the layer and (ii) an active region in the layer disposed adjacent said pair of electrodes; and a plurality of inactive regions in said the arranged between adjacent sensing regions. The inactive regions and the sensing regions are dosed with a desensitizing agent, the inactive regions receiving a relatively higher dose of the desensitizing agent and the sensing regions receiving a relatively lower dose of the desensitizing agent. The active layer is preferably placed in a monolithic Fabry-Perot cavity to enhance the optical efficiency and performance of the sensor.

22 Claims, 6 Drawing Sheets

ENHANCED PHOTO-EMF SENSOR WITH HIGH BANDWIDTH AND LARGE FIELD OF VIEW

CLAIM OF BENEFITS OF PROVISIONAL APPLICATION

Applicants claim the benefits of their co-pending U.S. Provisional application Ser. No. 60/325,278, filed on Sep. 26, 2001, the contents of which are hereby expressly incorporated herein in their entirety by this reference.

TECHNICAL FIELD

The present invention relates to non-steady-state photo-induced electromotive force (EMF) detectors and to a class of detector with, potentially, an improved field of view (FOV), bandwidth and photon collection efficiency. This is a class of adaptive detectors, also known as a photo-EMF sensors, enable signals to be detected coherently in the presence of dynamic optical distortions including speckle, beam-wander, and wave front distortions from atmospheric turbulence and the like. Such sensors can also sense a rapid lateral motion of an optical pattern of complex shape. Applications for photo-EMF sensors include laser remote sensing, laser communications, compensated vibrometry, laser-based ultrasound sensing and RF photonics systems.

BACKGROUND OF THE INVENTION

Present photo-EMF sensors have an FOV limited to about 1.5 degrees, which stems from the small crossing angle of the interfering beams at the sensor required to produce an interference pattern with a period (spacing) on the order of the carrier diffusion length (about 60 micrometers for GaAs) for maximum response. The responsiveness of the device typically drops off rapidly for smaller crossing angles (or, equivalently, larger FOVs). The present invention can increase the FOV by an order of magnitude, without loss in responsivity (limited only by the capacitive effects). This enables the sensor to be more robust in the face of a large-angle scattered beams, spatial patterns with higher spatial bandwidth or images with finer spatial features or detail.

Also, present photo-EMF sensors have a bandwidth limited to about 100 MHz, which stems from the carrier lifetime, which is about 10 nanoseconds. The device bandwidth can be increased by reducing the carrier lifetime, for example, by ion implantation in the active regions of the detector. However, the ion implantation has a side effect in that the photo-EMF sensor exhibits a dramatic reduction in device responsiveness, defined to be the photo-current generated per watt of detected optical power per radian of differential phase shift of the interfering beams incident on the photo-EMF sensor. The present invention enables one, in essence, to recover partially the responsiveness resulting in a device with a much greater bandwidth (projected to be in the one to ten gigahertz regime), thereby making this sensor useful for myriad communication and remote sensing applications, as well as for high-frequency ultrasound and RF photonics applications.

Figure 1:
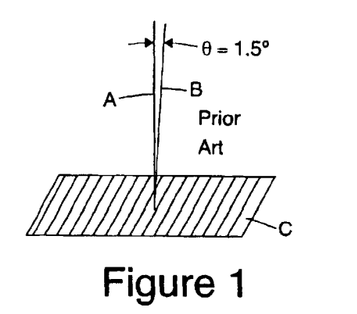
FIG. 1 shows the Field of View (FOV) typically available with prior art devices.

Prior art photo-EMF sensors come in two basic device geometries. The basic sensor, using a single pair of surface electrodes and an improved sensor using an Asymmetric InterDigitated Contact (AIDC) configuration to improve the device responsiveness. The basic sensor, which utilizes a pair of relatively widely spaced electrodes (typically many mm apart), has a rather low responsiveness ($10^{-4}$ to $10^{-5}$ A/W-radian), a limited field of view ($\approx 1.5°$) and additionally a limited bandwidth ($\approx 100$ MHz). The limited FOV of prior art devices is represented by FIG. 1. The improved structure (the AIDC configuration) improves responsiveness of the basic sensor by as much as two orders of magnitude, but does not improve its field of view, its bandwidth or its photon collection efficiency.

SUMMARY OF THE INVENTION

Briefly and in general terms, in one embodiment, the present invention provides a photo-EMF sensor which has a substrate with a semiconducting layer; a plurality of sensing regions in the layer, each sensing region including (i) a pair of electrodes disposed in, on or above the layer and (ii) an active region in the layer disposed adjacent to said pair of electrodes; and a plurality of inactive regions in the layer arranged between adjacent sensing regions. The inactive regions and the sensing regions are dosed with a desensitizing agent, such as protons, the inactive regions receiving a relatively higher dose of the desensitizing agent and the sensing regions receiving a relatively lower dose of the desensitizing agent. The notion of desensitizing the active region of a photo-EMF sensor is counter-intuitive in this art since, without employing the other aspects of this invention, it would degrade the sensor in terms of its responsiveness.

In another embodiment,. the present invention provides a method of making an interdigitated photo-EMF sensor. A substrate is made or provided having at least a layer of a semiconducting material disposed at a major surface thereof. A plurality of sensing regions are formed in said layer, each sensing region including (i) a pair of electrodes disposed adjacent said layer and (ii) an active region in said layer disposed adjacent said pair of electrodes. A plurality of inactive regions are formed in said layer arranged between adjacent sensing regions. The inactive regions and the sensing regions are dosed with a desensitizing agent, the inactive regions receiving a relatively higher dose of said desensitizing agent to thereby cause a relative higher level of defects to occur therein and said sensing regions receiving a relatively lower dose of the desensitizing agent to thereby cause a relative lower level of defects to occur.

In one embodiment the present invention may be constructed using an asymmetric Fabry-Perot structure where the active region of the photo-EMF sensor is disposed between the pair of reflecting mirrors of the asymmetric Fabry-Perot structure, with the reflecting mirror having the lower coefficient of reflection being on the light-sensing side of the photo-EMF sensor. Using an asymmetric Fabry-Perot structure improves the absorption of photons by the sensor and minimizes Fresnel reflections. Moreover, the reflecting layer having the lower coefficient of reflection, also conveniently serves as a capping layer that reduces undesirable surface recombination of carriers.

DETAILED DESCRIPTION OF THE INVENTION

Figure 2:
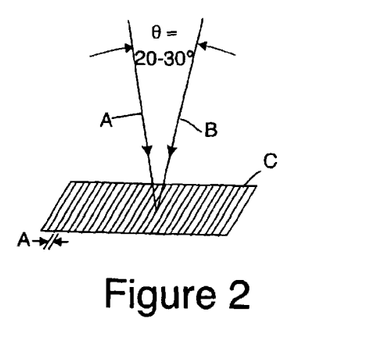
FIG. 2 shows an increased Field of View (FOV) of the type which can be realized in accordance with the present invention.

FIGS. 1 and 2 depict two interfering beams A, B which illuminate the surface of a sensor C giving rise to an optical interference pattern which is depicted by the parallel lines on the surface of the sensor. In the prior art the angle θ between the two beams is constrained to approximately 1.5°. This angle is referred to as the field of view or "FOV". When a sensor such as the sensor disclosed herein is utilized, this constraint on the FOV is substantially overcome in that the FOV or θ can now be in the range of 20° to 30° and indeed θ can be as large as approximately 45°. This is consistent with a very fine grating period at the sensor since the spacing of the grating is equal to:

$$\Lambda = \frac{\lambda}{2}\sin(\theta/2)$$

where Λ=grating spacing, λ=wavelength of the laser beams, and θ=the FOV.

Figure 3:
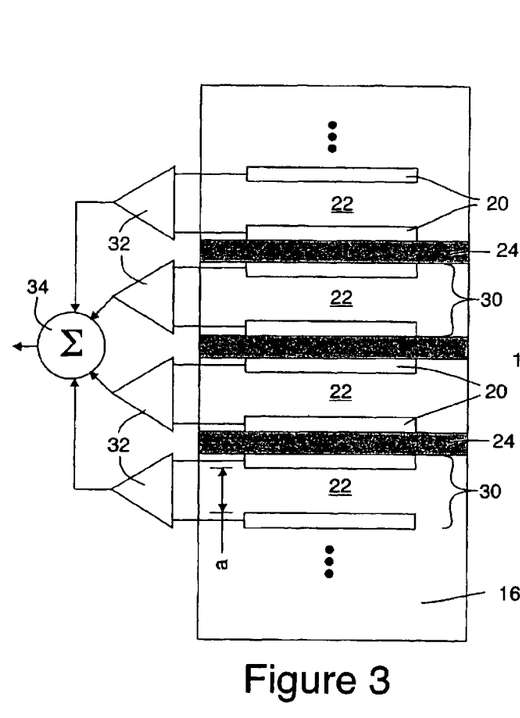
FIGS. 3 and 4 are top and section views of an asymmetric interdigitated contact (AIDC) configuration sensor in accordance with the present invention.
Figure 4:
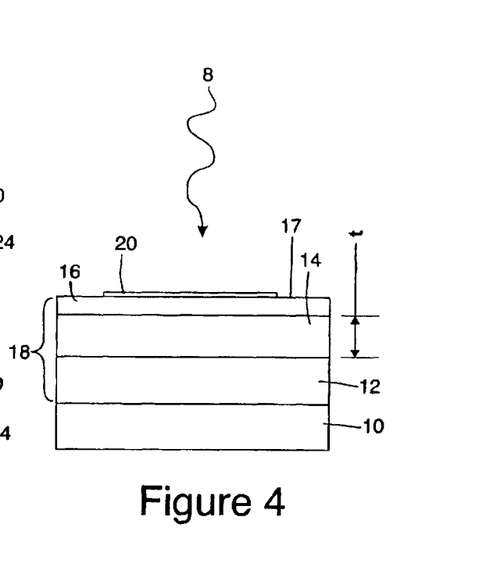

FIGS. 3 and 4 show a sensor with an asymmetric interdigitated contact (AIDC) configuration. The AIDC pattern of contacts 20 can be seen in FIG. 3 on the surface 17 of the sensor. The sensor is fabricated on a substrate 10 having an active layer 14 which defines a plurality of active regions 22. Numeral 22 refers to the sensors' active regions when viewed in a plan view (see FIG. 3) while numeral 14 refers to the active layer (or region) of a given sensor when viewed in an elevation view (see FIG. 4). In one embodiment, layer 14 might well be disposed directly on substrate 10. The thickness, t, of the layer 14 then should be greater than the linear photon absorption length to ensure that incoming photons 8 are absorbed. For above-the-bandgap photons, layer 14 will typically have a thickness t<1 μm. If the photons are below the bandgap, then the active layer 14 would have to be much thicker to ensure absorption of the photons. That would be undesirable since it would adversely affect the bandwidth of the device, and improving bandwidth is one of the objects of the present invention. Moreover, the maximum thickness of the active layer 14 may be limited to less than the absorption length (in the latter case) by practical considerations relating to the growth or deposition of the thin film material.

As will be described in greater detail subsequently, the sensor's bandwidth is increased by reducing the carrier lifetime by techniques including, but not limited to, ion implantation and low temperature annealing in the active region(s) 14, 22 of the detector.

In order to make the active layer 14 efficient in absorbing incoming photon, in another embodiment, a Fabry-Perot optical cavity 18 is formed with two reflecting surfaces on either side of the active layer 14. The Fabry-Perot optical cavity 18 is preferably asymmetric and monolithic. Since the cavity 18 is preferably, asymmetric, the coefficient of reflection is greater for one mirror than the other mirror. A first reflector 12 is provided therein as can be seen in FIG. 4. This first reflector 12 has a greater coefficient of reflection than has the second reflector 16, which reflector 16 can also conveniently serve as a capping or passivation layer. The reflectors 12, 16 are disposed on either side (top and bottom) of the active region or layer 14 of the sensor. The cavity 18 can enhance the optical intensity throughout the thickness of active layer 14 thereby improving the efficiency of the latter.

The active layer 14 is formed on or over reflector 12 (for example, if a Fabry-Perot optical cavity 18 is used or if another reflector is used) or on or over substrate 10 (if neither a Fabry-Perot optical cavity nor another reflector is used) and preferably comprises an epitaxial layer of GaAs, AlGaAs, or the like. Other materials may be utilized for region 14 including, other semiconductor materials (such as superlattice structures of group III–V or other materials, single epitaxial layers, quantum well materials, etc., and/or layers of GaAs, AlGaAs, InP, CdTe, Si, etc), ferro-electric oxides and various polymers.

The active layer 14 has a thickness 't' which is typically greater than the linear photon absorption length for above-the-bandgap photons (typically the epitaxial layer 14 will have a thickness t<1 μm). Using the optional, but preferred, asymmetric Fabry-Perot optical cavity 18 discussed briefly above, and in more detail below, the active region(s) 22 can have a thickness that is much less than the absorption length. The cavity 18 essentially confines the light to the active region or layer 14 since light entering the Fabry-Perot optical cavity bounces or reflects between the two reflecting surfaces or mirrors 12, 16 as it is a being absorbed in the active region or layer 14.

A set of parallel electrodes 20 with an asymmetric spacing (the AIDC) is placed on or over the epitaxial layer 14 with active regions 22 of the sensors, each having a width 'a', being defined between electrode 20 pairs to define individual sensing regions 22. A transparent capping or passivation layer 16 may be optionally used between the epitaxial layer 14 and the electrodes 20 if a Fabry-Perot optical cavity 18 is not used. If a Fabry-Perot optical cavity 18 is used, then the capping layer is preferably provided by the second reflecting surface 16 so that an additional capping or passivation layer is then unnecessary, but rather optional.

The isolating or inactive regions 24 are formed between adjacent ones of the sensing or active regions 22, the isolating regions 24 being formed by (i) opaque (or reflective), high resistivity masks or (ii) by local ion implantation since ion implantation decreases the carrier lifetime and therefore the sensors' gain in such regions, thereby minimizing back-action photo-currents which can otherwise cancel the desired currents in the active regions 22.

A capping layer 16, if utilized, can serve several functions: as an anti-reflection coating to minimize reflective photon losses, as a mirror of a Fabry-Perot optical cavity 18 and also to improve the lifetime of the sensor by minimizing surface defects that can occur over time. As such, the use of a capping layer 16 is generally preferred. The capping layer 16 may be $SiO_2$ or an AlGaAs epitaxial layer, for example, or a superlattice structure.

The second reflector 12 of the asymmetric Fabry-Perot cavity 18 is preferably provided to reflect incident photons back into active regions 22 in active layer 14. Reflector 12 can be implemented by a multi-layer Bragg reflector, such as alternating layers of GaAs and GaAlAs, or a highly reflective metal layer, thereby "confining" the incident light to interact more efficiently in the active layer 14. The latter example would necessitate disposing an electrically insulating layer (e.g. $SiO_2$) between layer 12 and the active layer 14 to avoid electrically short circuiting of the optically induced charge distribution in active layer 14.

The asymmetric Fabry-Perot sensor embodiment has three basic elements disposed on a substrate: a highly reflective back reflector 12, a thin active layer 14, and a low-reflectivity capping layer 16. The capping layer 16 in this embodiment preferably serves a dual function: (i) it completes the asymmetric Fabry-Perot structure and, moreover, (ii) it inhibits undesirable carrier recombination that would otherwise occur at the air/active layer interface. The asymmetric Fabry-Perot active layer thickness, 't', and the reflectivity of the capping layer 16 and bottom layer 12 are selected so that for the optical wavelength of operation, the light is effectively trapped, or, confined, between the two reflecting layers 12, 16. Under these conditions, nearly all the light is confined to interact with the active layer 14 with minimal transmission beyond layer 12 into substrate 10. Thus, there is a minimal reflective loss from the device structure, so that the structure behaves as its own anti-reflective device (since all the light is confined to the active layer). Moreover, since all the light is confined to the active layer (by virtue of the multiple reflections and the optical phasing of the reflected beams), the active layer will eventually absorb most of the light.

Thus, the thickness, t, of the active layer 14 need not necessarily be as thick as an optical absorption length. In fact, the active layer 14 can be much less in thickness relative to an optical absorption length. In this case, the effective optical path (the physical thickness of layer 14 times the effective number of multiple passes within the asymmetric Fabry-Perot structure 18) should be on the order of, or greater than, the numerical value of the optical absorption length. This enables a variety of materials to be used for this sensor which would otherwise be impractical, allowing the use of media for the active region 14 having with relatively low optical absorption. This is true, since a low absorbing layer will, upon making many optical reflections within the structure 18, absorb a substantial amount of the incident light in active region 14. As an example, GaAs grown at low temperatures can be made with metal nano-clusters formed by arsenic precipitates and has modest absorption (1000 inverse cm) at an 1.06 $\mu$m optical wavelength (see, for example, D. D. Nolte, J. Appl. Phys, 1994, volume 76, page 3740). Such materials have a practical limit of about one micron in thickness. By forming an asymmetric Fabry-Perot using this GaAs medium as the active layer 14, a photo-emf sensor operating at 1.06 $\mu$m can be fabricated with good detectivity.

In addition, given that the effective optical thickness of the structure can be very small, the transit time through the structure will be rapid, thereby enabling the response time of the device to be very short and not influence the bandwidth of the detector.

Recall that the basic photo-emf sensor requires a structure whose active layer possesses both high electrical resistivity as well as high optical absorption, such as obtained using semi-insulating semiconductor materials (bulk semiconductor layers as well as multiple quantum wells are examples). Given this requirement, the interface between the active layer and the surrounding reflective structures of the asymmetric Fabry-Perot preferably possesses high resistivity. Semiconductor Bragg reflecting layers (such as GaAs and AlGaAs can be used) as well as insulating layers such as $SiO_x$ can serve as the desired buffer to inhibit potential electrical shorting out of the lateral dynamic charge carrier patterns generated in the active layer 14 during operation. This condition is in direct contradiction and counter-intuitive to conventional wisdom in terms of fabricating a traditional detector within an asymmetric Fabry-Perot device. In that case, the reflectors can be electrically conductive since the detector does not possess any lateral charge distribution pattern. The present invention makes use of such a lateral charge distribution pattern and therefore the Fabry-Perot reflector surfaces should be electrically isolated from the lateral charge distribution in the active region 14, 22.

It should also be noted that metallic layers can also serve as the high-reflection bottom layer, 12, with the additional proviso that a transparent insulating layer, such as $SiO_x$ be deposited between the metallic layer and the active layer, 14, to provide a high resistivity interfacial barrier.

Note also that the fabrication steps required to realize a large field of view and a high-bandwidth photo-emf detector (such as ion implantation or low-temperature growth) will not adversely affect the reflective and capping layers 12 and 16. This follows since these processes do not increase the electrical conductivity of layers 12 and 16, nor do they materially affect the optical (dielectric) properties of the semiconductive Bragg reflective layers 12 and 16. Moreover, the field of view of the device will not be materially affected by the asymmetric Fabry-Perot structure, since the Q of this class of structure is in the range of 10.

The sensor of FIG. 3 is depicted with four sensing regions 22 as associated pairs of electrodes 20. As will be seen from the subsequent discussion, sensors having more than four pairs of electrodes 20 have certain advantages. The series of three dots at each end of the sensor reflect the fact that the individual sensors 22 may repeat many times on one substrate 10.

The electrode pairs are each preferably connected via a transimpediance buffer amplifier 32 to a summing amplifier 34 for the purpose of summing the currents generated in the individual sensing regions 22 as voltages at the summing amplifier 34.

The width 'a' of the active region in each sensing region 22 between an electrode pair 20 is equal to about one diffusion length spacing for optimal photo-current response, which length is typically in the 60 $\mu$m range for GaAs (this range may vary depending on the sensor material utilized) for a conventional prior art photo-emf sensor.

A photo-EMF detector senses a rapid lateral motion of an optical pattern across its surface and generates a dynamic current in response to this rapid motion. In many applications, the optical pattern is in the form of a laterally moving optical interference pattern or alternatively it can be in the form described as a moving speckle pattern. The lateral motion can be the result of a transient optical phase shift imposed onto one of the beams that forms the interference pattern. It is the transient phase shift which is the parameter desired to be sensed and the transient phase shift can result from a optically phased-modulated signal, or from the motion of the surface that a probe beam encounters on the way to the sensor. In the latter case only a single beam is used, since the rapid lateral motion of its speckle pattern is desired to be sensed. The sensor is adaptive in that slow changes in the pattern of motion (slow that is relative to the space-charge formation time) are tracked by the sensor and do not generate output photo-currents. Thus, the sensor, in essence, behaves as a high-pass filter, providing a useful signal for the desired rapid motion (>100 kHz) of the pattern, yet, suppressing slowly varying (<10 kHz) features, due to mechanical vibrations, beam wander, propagation distortions (caused by a turbulent atmosphere, for example), multi-mode fiber-induced speckle, etc., as well as static wave front distortions in the form of speckle or optical-component aberrations.

The photo-EMF sensor responds best to an optical pattern whose dominant feature size (e.g. speckle), spacing, or period, is on the order of the carrier diffusion length of the sensor material. For GaAs, this corresponds to about 60 $\mu$m. In the prior art, the required crossing angle of a pair of laser beams to form such a large-period pattern was about 1.5 degrees, and this angle, therefore, determined the field-of-view of the device (See FIG. 1). In-the prior art dimension 'a' (shown on FIG. 3) is typically 60 $\mu$m or greater. For many applications, such a small field of view is satisfactory. However, there are many applications whose incident optical beam(s) span a much greater angle than 1.5 degrees, such as speckle from highly multi-mode fibers, large-angle scattering for remote sensing applications, etc. It is therefore one goal of the present invention to increase the acceptance angle for a sensor without significantly impacting the sensor's responsiveness.

Figure 5:
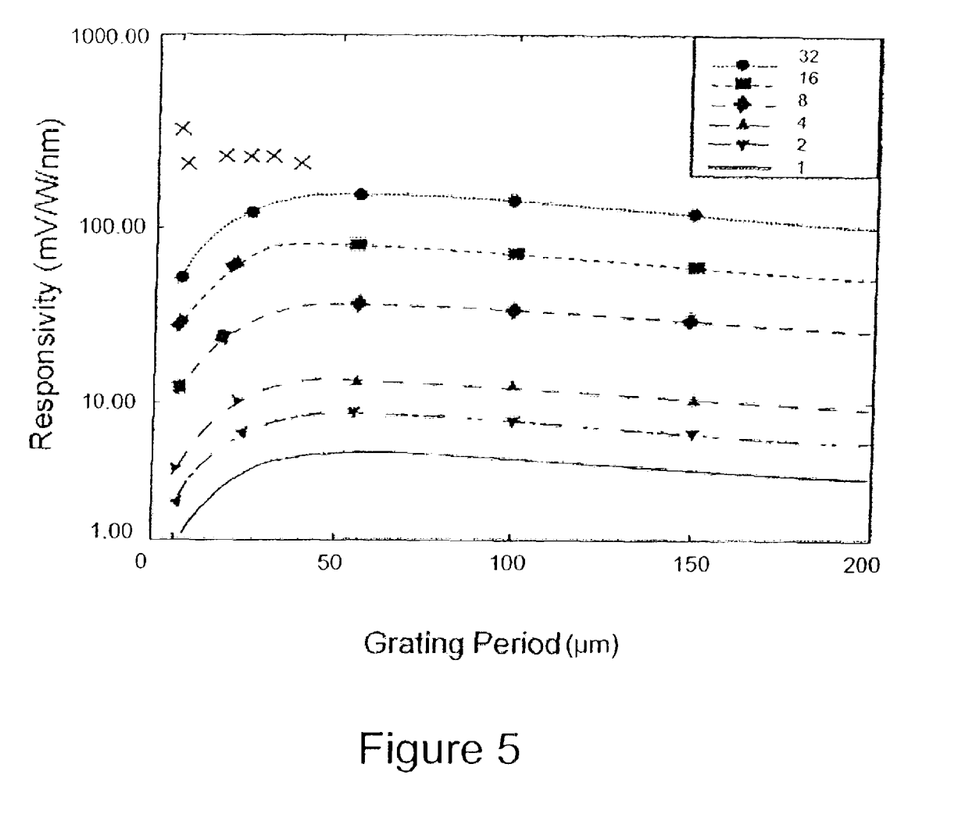
FIG. 5 is a graph of AIDC responsiveness versus grating period for sensor having 2 to 32 pairs of electrodes.

FIG. 5 depicts measurements made on devices with AIDCs ranging from single-pair structures to 32-pair electrode configurations. In all cases, the smallest active detection width 'a' is greater than 60 μm and hence follows the teachings of the prior art. The isolation regions (identified by numeral 24 in FIG. 3) were inhibited using ion implantation—a simple mask shielded the active regions from a high ion implantation dose. The small x's indicate what might be considered to be an ideal solution: improved responsivity, especially at very small grating periods. As the grating period lessens the FOV increases, so an improved FOV requires that the responsivity be improved especially at small grating periods.

The present invention goes far beyond the prior art and is disclosed in terms of two basic embodiments. In the first basic embodiment, the field of view is projected to improve by more than an order of magnitude (from about 1.5 degrees to approximately 45 degrees) while still maintaining an improved responsiveness as in the case of the prior art AIDC structure. An AIDC structure has been described in terms of a number of embodiments, including the aforedescribed and preferred asymmetric Fabry-Perot embodiment. In the first basic embodiment, the width 'a' of active regions 22 between the sensor electrodes 20 is reduced to a length which is much less than the diffusion length for the sensor material being utilized.

The second basic embodiment of the present invention projects an increase in the sensor bandwidth by as much as two orders of magnitude (from about 100 MHz to more than 10 gigahertz) also with an improved field of view (again, by a factor of 10 times better than the prior art) while still providing a sensor responsiveness typically as good as or better than that available in the prior art. The second basic embodiment is an further improvement over the first basic embodiment and can be used with the various embodiments discussed above with reference to the first basic embodiment. The asymmetric Fabry-Perot embodiment discussed above with reference to the AIDC structure also improves the bandwidth of the sensor.

In the second basic embodiment, bandwidth and responsiveness are now traded off one against the other so that if one desires to improve bandwidth further, the improvement in responsiveness from following the teaching of the first basic embodiment will be reduced accordingly (this is similar to the notion for electric amplifiers that the gain-bandwidth product is a constant). Conversely, if one desires to improve the responsiveness, then the bandwidth is reduced accordingly. Nevertheless, depending on the application, those skilled in the art who follow the teachings of the present invention now have control over (1) the field of view, (2) the bandwidth and (3) the responsiveness of sensors.

In addition, by the use of the asymmetric Fabry-Perot cavity 18 with a stacked reflector 12 in combination with layer 16, which also can function as a capping layer structure, the photon efficiency of the sensor is enhanced.

In accordance with the first basic embodiment of the present invention, an AIDC sensor has a plurality of active regions 22 each having a width 'a' that is much smaller than the diffusion length of the semiconducting material used for the active layer 14. In the case of GaAs the diffusion length is about 60 μm and, in accordance with the first basic embodiment of the invention, length 'a' is much smaller than the diffusion length (preferably about 20 μm in the case of GaAs, i.e., about ⅓ of the diffusion length of the material used for the sensing region 22). This is in direct contradiction to conventional wisdom since the responsiveness of the sensor would be expected to decrease. Even though there will be a roll off of the sensor responsiveness at smaller grating periods (see FIG. 5), since the space-charge field decreases with smaller grating periods, the basic sensor gain at a given grading period will not degrade since the carrier lifetime-to-propagation time ratio is unchanged. By increasing the number of AIDC sensor regions (to approach the smallest optical pattern or grating spacing), the roll-off in sensor responsiveness can be compensated for by the increased number of photo-current sensing regions 22 which result from using the AIDC design. Thus, there should be little or no reduction in sensor responsiveness for a very short period gratings, so long as the AIDC spacing is chosen to be the same. This follows, since the space-charge field roll-off scales as a grating period, yet, the number of summation points increases by the same factor. Only the device capacitance and the fill-factor of the AIDC pattern will prevent a perfect offset to occur. Nonetheless, significant compensation should occur with the result being that the field of view of the detector can be increased from 1.5 degrees to better than 45 degrees with little or no compromise in sensor responsiveness.

Also shown in FIG. 5 is a desired increase in sensor responsiveness (indicated by the "x" marks), where it is assumed that the sensor is fabricated with the number of AIDC pairs that matches the optical fringe pattern for each value of the grating period. Thus, as a grating period gets smaller, the number of the electrode pairs increases accordingly. The larger number of electrode pairs 20 should give rise to a corresponding increase in sensor responsiveness, owing to the constant gain (the ratio of carrier lifetime-to-propagation time). The result is that the sensor responsiveness should remain fairly constant at smaller grating periods. Since the smaller grating periods correspond to larger crossing angles of the interfering beams, the field of view of the device is expected to increase accordingly from about 1.5 degrees to greater than 45 degrees.

The second basic embodiment of this invention deals with the bandwidth of the photo-EMF sensor. Typically, the bandwidth is limited to the carrier recombination time, or carrier lifetime. For GaAs, this lifetime is on the order of 10 nanoseconds, resulting in a bandwidth of about 100 MHz. This value suggests that the art may have reached the limits of the device given present as-grown GaAs material.

One can realize an increase in bandwidth by decreasing the carrier lifetime. The increase in the bandwidth can be obtained by ion implantation. The price one pays for the increase in bandwidth is that the sensor gain decreases accordingly, given that the increase in the bandwidth is proportional to the ratio of the carrier lifetime to the carrier transport time.

In the second basic embodiment of the present invention, the responsiveness enhancement scheme described above (the increase in electrode density of the AIDC contacts by decreasing the width of each active region to a length that is much less than the diffusion length) is combined with a reduction in carrier lifetime in the active regions to achieve a system and gain-bandwidth trade-off in overall performance. The increased sensor bandwidth (due to the reduced carrier lifetime) resulting from ion implantation in the active regions will be offset, in part, by the increased number density of current-summing electrodes 20. Another benefit of the increased density of contacts is the increased field of view of the device, which is dictated by the spacing of the electrodes (and not by its local response, or gain). In the prior art, the only regions considered for ion implantation are the so-called isolation regions 24. Thus, the prior art does not suggest, or anticipate, using ion implantation in the active regions 22. Thus, as in the case of the first embodiment noted above, the second embodiment also tends to contradict conventional wisdom for such sensors in that ion implantation may be used in active regions 22 to decrease the carrier lifetime. Of course, other techniques than ion implantation can be used to decrease the carrier lifetime, if desired.

Figure 6:
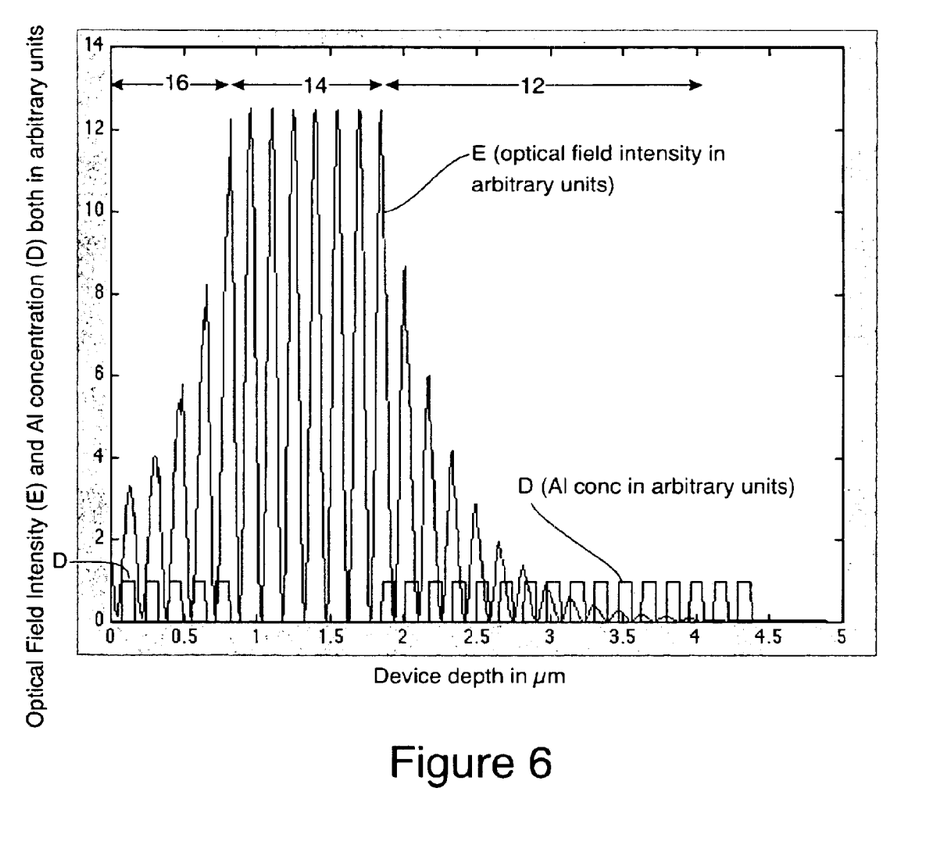
FIG. 6 is a schematic diagram of a Fabry-Perot embodiment of the sensor operating as a standing-wave cavity at 1.06 $\mu$m with a graph of the amplitude of the inside the cavity and in the adjacent Bragg reflector surfaces.

FIG. 6 shows results of a calculation of the internal optical field within the proposed structure (shown on the vertical axis—see FIG. 4) as a function of the depth into the device (measured from the sensing surface 17 in μm and shown on the horizontal axis). The structure is comprised of a Bragg reflective capping layer 16 comprised of alternating layers of GaAs and AlGaAs; a thin active region 14 of low-temperature GaAs of thickness approximately one micron; and an internal high-reflectivity Bragg grating, comprised of alternating layers of GaAs and AlGaAs, which serves as a high reflective region 12. Note that the optical field E is almost completely confined within the active layer 14 (of thickness t as shown by FIG. 4), with minimal light penetrating beyond the internal reflective layer 12 as well as outside the capping layer 16. Thus, even with a modest absorbing medium (in the case, GaAs, operating at an optical wavelength of 1.06 μm), the sensor is very efficient in terms of absorbing most of the incident light into the active layer 14 of the photo-emf detector (which has a physical thickness much less than the absorption length at 1.06 μm). In regions 16 and 12 layers of GaAs and AlGaAs alternate. Line D shows the concentration of Al varying those regions.

Figure 7:
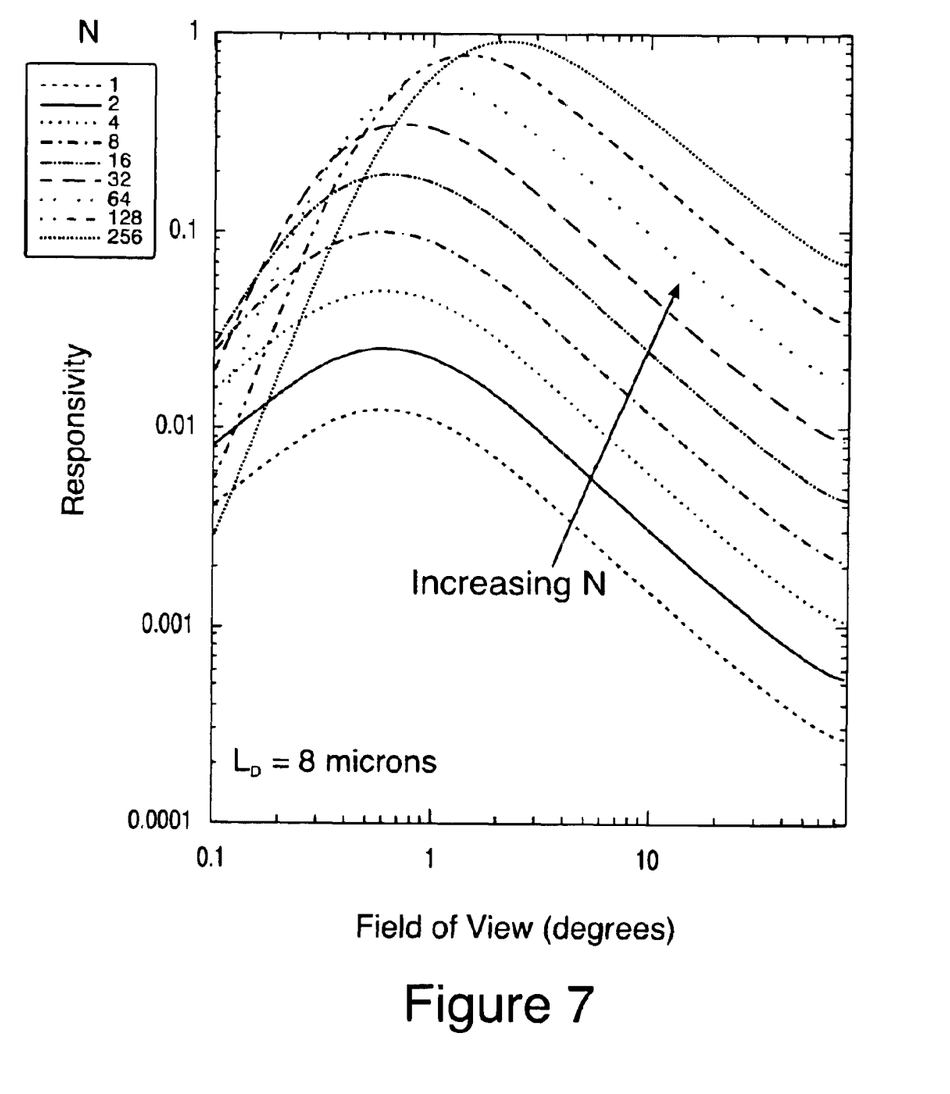
FIG. 7 is a graph of the calculated responsivity of a sensor versus FOV for various numbers of electrode pairs, but with a constant diffusion length.

FIG. 7 shows a calculation of the performance of the photo-emf sensor described with reference to FIG. 6. In FIG. 7, the relative responsivity is plotted as a function of the field of view, for several values of the number N of interdigitated active regions (see numerals 22 in FIG. 3), for a fixed total active region width (N·a) of the detector. Note that the field of view increases, as does the responsivity, as the number of contacts is increased. This calculation assumes a diffusion length $L_D$ of 8 μm in the active layer 14 remain constant. This calculation also takes into consideration an ad hoc screening term to describe the disruption of the space charge induced by the contacts (22, in FIG. 3) that occur for short active region widths, and become more apparent as the number of contacts (N in FIG. 7) increases. In FIG. 7, the overall lateral active dimension of the detector is 2 mm, and, for N=128, the active width between contacts 22 (see "a" in FIG. 3) is about 16 μm, which is about equal to the diffusion length, in accordance with the premise of this invention.

Figure 8:
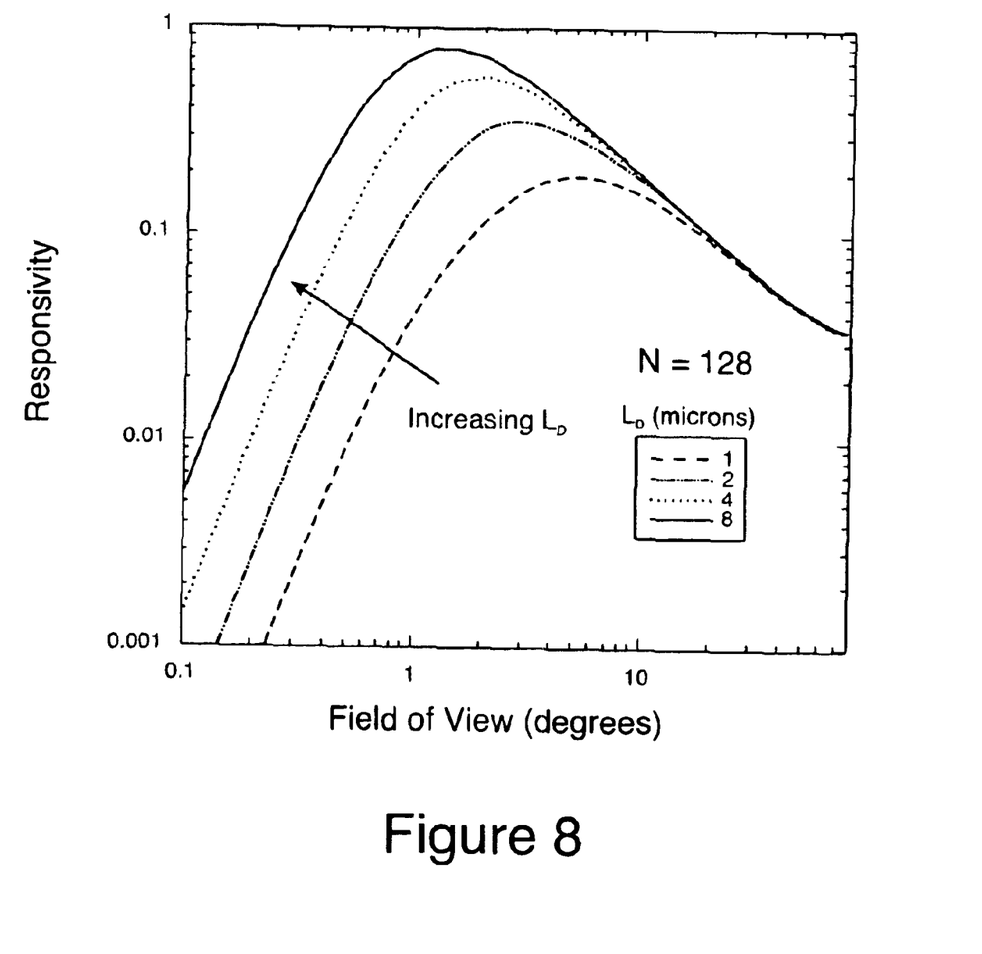
FIG. 8 is a graph of the calculated responsivity of a sensor versus FOV for various diffusion lengths with a constant number of electrode pairs.

FIG. 8 shows a calculation of the detector response as a function of the field of view, parameterized as a function of the carrier diffusion length (under the same conditions as in FIG. 7). In this case, a fixed number of active regions (128 regions) is assumed, again for a total active width of 2 mm. Note that the field of view, as well as the responsivity both improve as the carrier diffusion length increases, which, as discussed earlier, can be realized via implantation techniques, as well as via low-temperature growth conditions (the latter technique being applicable, at least, to GaAs).

Figure 9:
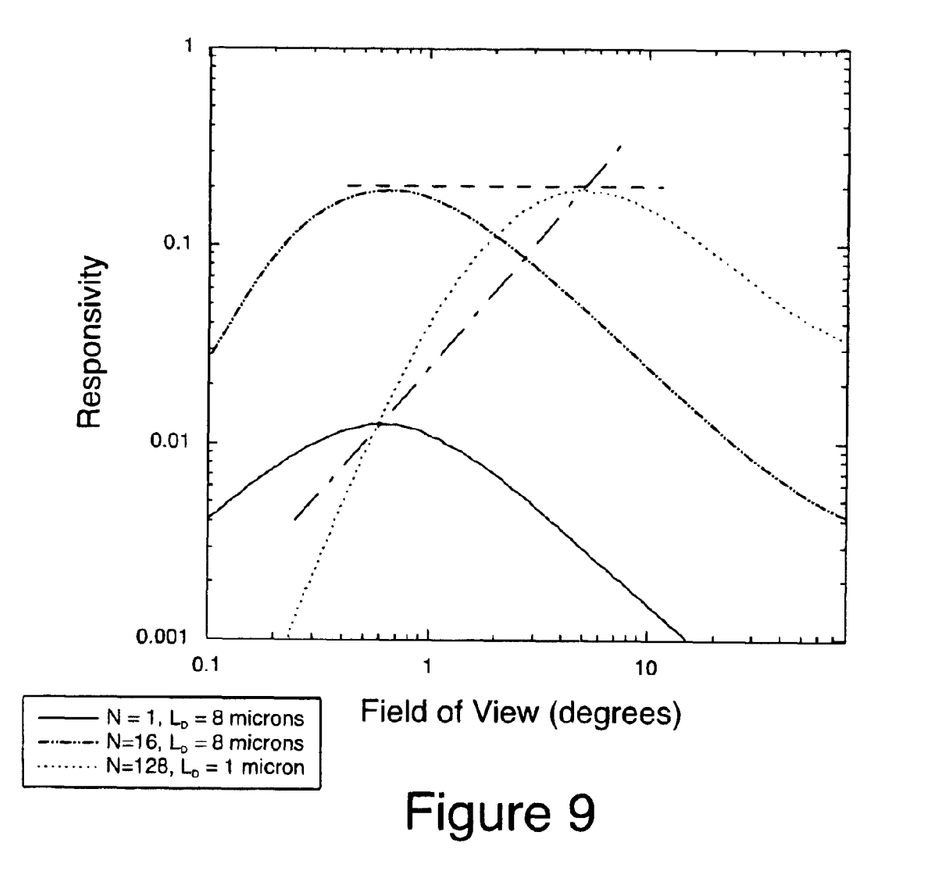
FIG. 9 is a graph of the calculated responsivity of a sensor versus FOV for various diffusion lengths and various number of electrode pairs.

Finally, FIG. 9 shows a calculation of the detector performance as a function of the field of view as both the number of contacts and the diffusion length are varied according to the present invention. Note that as the number of contacts is increased and the carrier diffusion length $L_D$ is decreased, the field of view increases without penalty in the detector responsivity. The decrease in carrier diffusion length occurs concomitantly with a decrease in carrier lifetime. Thus, the bandwidth of the device will increase as the carrier lifetime decreases, in accordance with the claims of this invention.

In order to fabricate a device in accordance with the second basic embodiment of the present invention, one or two masks and two ion implantation steps may be used. A first mask is used to shield the active regions 22 and the contact regions 20 so that the inactive regions 24 (the back-action regions as well as surrounding regions) can be implanted with a relatively high dose ($10^{13}$ per cm$^2$) of protons having an energy of, for example, 130 keV. After this step, one can then optionally mask over the inactive regions and implant the active regions with a relatively lower dose (approximately $10^{10}$ to $10^{12}$ per cm$^2$) of protons having an energy of, for example, 130 keV. This is sufficient to achieve the desired bandwidth, yet not so great as to diminish the gain appreciably (the previously discussed sensor gain-bandwidth tradeoff in action). Of course, the optional masking step may be omitted here since the second ion implantation may certainly add to the implantation in the inactive regions 24. The order of the steps can be changed. For example, the relatively lower dose can be implanted into the active regions 22 (and possibly also into the inactive regions 24 and the contact regions 20 at the same time). Then the active regions 22 can be masked and the relatively higher dose implantation performed on the inactive regions 24. Since the implantation dose in the inactive regions 24 will typically be orders of magnitude greater than the implantation dose of the active regions 22, the relatively low level dose of the active regions 22 will have basically no effect upon the dose given the inactive regions 24 if the inactive regions 24 also receive the low level dose intended for the active regions 22. As such, a single mask can typically be used which shields the active regions 22 from the high level dose intended for the inactive regions 24. The regions under the electrode 20 may be implanted or only the areas between the electrodes can be implanted. Making the implantation under the electrodes may result in some performance degradation, but that may be more than offset by the simplification resulting simplification in the manufacturing steps required to make the sensor.

The implantation steps cause damage to the lattice structure of the material used for the active and inactive regions (preferably GaAs and GaAs compounds in the disclosed embodiments). The lattice damage caused the lifetime of the carriers to be reduced as is desired. While protons are preferred for use in implantation into the active regions 22 to reduce the carrier lifetimes, other particles or molecules can be used or other techniques can be used, if desired, to induce defects in the lattice structure of the active regions 22 in order to decrease the carrier lifetimes therein and also to form in the inactive or isolating regions 24. Also, while protons are preferably used to desensitize both the active and inactive regions, different desensitizing agents could be used for the active and inactive regions, if desired. For example, other impurities could be used to induce the lattice damage or lattice damage can be realized by a low temperature anneal (at least for the global reduction in the carrier lifetimes in the active regions 22, followed with a more conventional implantation in the inactive regions to cause greater lattice damage there—a mask being utilized to protect the active regions from further lattice damage by such implantation).

Having described the invention in connection with several embodiments thereof, modification will now certainly suggest itself to those skilled in the art. As such, the invention is not to be limited to the disclosed embodiments except as required by the appended claims.

What is claimed is:

1. An interdigitated photo-EMF sensor comprising:
   a substrate;
   a plurality of sensing regions in said substrate, each sensing region including (i) a pair of electrodes disposed adjacent said substrate and (ii) an active region in said substrate disposed adjacent said pair of electrodes; and
   a plurality of inactive regions in said substrate arranged between adjacent sensing regions,
   wherein the inactive regions and said sensing regions are dosed with a desensitizing agent, the inactive regions receiving a relatively higher dose of said desensitizing agent to thereby cause a relative higher level of defects to occur therein and said sensing regions receiving a relatively lower dose of the desensitizing agent to thereby cause a relatively lower level of defects to occur therein.

2. The interdigitated photo-EMF sensor of claim 1 wherein the desensitizing agent is a dosage of protons.

3. The interdigitated photo-EMF sensor of claim 2 wherein the dose of protons in the inactive regions is $10^{13}$ per cm$^2$ or greater while the dose of protons in the sensing regions is $10^{12}$ per cm$^2$ or less.

4. The interdigitated photo-EMF sensor of claim 3 wherein the dose of protons in the sensing regions is $10^{10}$ to $10^{12}$ per cm$^2$.

5. The interdigitated photo-EMF sensor of claim 4 wherein said substrate includes an asymmetric Fabry-Perot structure to reflect incident photons passing through the sensing regions back into said sensing regions.

6. The interdigitated photo-EMF sensor of claim 1 wherein the substrate has a surface for supporting said electrodes and further including a transparent capping layer over said surface for passivating the surface and for minimizing optical reflections from the surface.

7. The interdigitated photo-EMF sensor of claim 1 wherein the substrate is selected from the group consisting of (i) semiconductors, (ii) ferro-electric oxides and (iii) polymers.

8. The interdigitated photo-EMF sensor of claim 7 said semiconductors are selected from the group consisting of GaAs, AlGaAs, InP, CdTe, and Si.

9. The interdigitated photo-EMF sensor of claim 1 wherein the pair of electrodes of a sensing region are spaced from one another by a distance which is much less than the diffusion length of said active regions.

10. The interdigitated photo-EMF sensor of claim 9 wherein the substrate includes at least a layer of GaAs and the distance by which a pair of electrodes of a sensing region are spaced from one another is approximately 20 micrometers.

11. The interdigitated photo-EMF sensor of claim 1 wherein the desensitizing agent for both the active regions and the inactive regions is implanted protons.

12. A method of making an interdigitated photo-EMF sensor comprising:

providing a substrate;

forming a plurality of sensing regions in said substrate, each sensing region including (i) a pair of electrodes disposed adjacent said substrate and (ii) an active region in said substrate disposed adjacent said pair of electrodes; and forming a plurality of inactive regions in said substrate arranged between adjacent sensing regions, wherein the inactive regions and said sensing regions are dosed with a desensitizing agent, the inactive regions receiving a relatively higher dose of said desensitizing agent to thereby cause a relative higher level of defects to occur therein and said sensing regions receiving a relatively lower dose of the desensitizing agent to thereby cause a relatively lower level of defects to occur therein.

13. The method of making an interdigitated photo-EMF sensor of claim 12 wherein the desensitizing agent is a dosage of protons.

14. The method of making an interdigitated photo-EMF sensor of claim 13 wherein the dose of protons in the inactive regions is $10^{13}$ per cm$^2$ or greater while the dose of protons in the sensing regions is $10^{12}$ per cm$^2$ or less.

15. The interdigitated photo-EMF sensor of claim 14 wherein the dose of protons in the sensing regions is $10^{10}$ to $10^{12}$ per cm$^2$.

16. The method of making an interdigitated photo-EMF sensor of claim 15 wherein said substrate includes an asymmetric Fabry-Perot structure to reflect incident photons passing through the sensing regions back into said sensing regions.

17. The method of making an interdigitated photo-EMF sensor of claim 12 wherein the substrate has a surface for supporting said electrodes and further including a transparent capping layer over said surface for passivating the surface and for minimizing optical reflections from the surface.

18. The method of making an interdigitated photo-EMF sensor of claim 12 wherein the substrate is selected from the group consisting of (i) semiconductors (ii) ferro-electric oxides and (iii) polymers.

19. The method of claim 18 said semiconductors are selected from the group consisting of GaAs, AlGaAs, InP, CdTe, and Si.

20. The method of making an interdigitated photo-EMF sensor of claim 12 wherein the pair of electrodes of a sensing region are spaced from one another by a distance which is much less than the diffusion length of said active regions.

21. The method of making an interdigitated photo-EMF sensor of claim 20 wherein the substrate includes at least a layer of GaAs and the distance by which a pair of electrodes of a sensing region are spaced from one another is approximately 20 micrometers.

22. The method of making an interdigitated photo-EMF sensor of claim 12 wherein the desensitizing agent for both the active regions and the inactive regions is implanted protons.

* * * * *